United States Patent [19]
Rickerby et al.

[11] Patent Number: 5,656,364
[45] Date of Patent: Aug. 12, 1997

[54] MULTIPLE LAYER EROSION RESISTANT COATING AND A METHOD FOR ITS PRODUCTION

[75] Inventors: David S. Rickerby, Derby, England; Pierre Monge-Cadet, Serres-Morlaas; Guy Farges, La Ville Du Bois, both of France

[73] Assignees: Rolls-Royce plc, London, England; Turbomeca Societe Dite, Bordes; Etat Francais-Delegation Generale Pour L'Armement, Paris, both of France

[21] Appl. No.: 408,612

[22] Filed: Mar. 22, 1995

[30] Foreign Application Priority Data

Mar. 23, 1994 [GB] United Kingdom ............. 9405744

[51] Int. Cl.⁶ ..................................... B32B 15/04
[52] U.S. Cl. ................... 428/216; 428/212; 428/336; 428/469; 428/472; 428/698; 428/704
[58] Field of Search ............... 428/469, 698, 428/704, 472, 212, 216, 336

[56] References Cited
U.S. PATENT DOCUMENTS

| | | | |
|---|---|---|---|
| 4,554,201 | 11/1985 | Andrew et al. | 428/215 |
| 4,643,951 | 2/1987 | Keem et al. | 428/469 |
| 4,692,385 | 9/1987 | Johnson . | |
| 4,753,854 | 6/1988 | Gavrilov et al. | 428/697 |
| 4,761,346 | 8/1988 | Naik | 428/629 |
| 4,835,062 | 5/1989 | Holleck . | |
| 4,895,770 | 1/1990 | Schintlmeister et al. | 428/698 |
| 4,925,346 | 5/1990 | Moskowitz et al. . | |

FOREIGN PATENT DOCUMENTS

| | | |
|---|---|---|
| 0289173 | 11/1988 | European Pat. Off. . |
| 0366289 | 5/1990 | European Pat. Off. . |
| 242 100 | 1/1991 | European Pat. Off. . |
| 2 130 251 | 5/1984 | United Kingdom . |

OTHER PUBLICATIONS

European Search Report dated Sep. 6, 1995.

*Primary Examiner*—Archene Turner
*Attorney, Agent, or Firm*—Cushman Darby & Cushman IP Group Of Pillsbury Madison & Sutro LLP

[57] ABSTRACT

A multiple layer erosion resistant coating on a substrate comprises alternate layers of tungsten and titanium diboride. All of the layers have the same thickness and preferably have thickness's of between 0.3 and 1 micrometer to give improved erosion resistance. The layers are produced by sputtering.

11 Claims, 4 Drawing Sheets

RATIO OF METAL LAYER THICKNESS / CERAMIC LAYER THICKNESS

THICKNESS OF METAL / CERAMIC LAYER (μm)

MULTIPLE LAYER EROSION RESISTANT COATING AND A METHOD FOR ITS PRODUCTION

FIELD OF THE INVENTION

The present invention relates to a multiple layer erosion resistant coating for surfaces of substrates, and in particular to multiple layer erosion resistant coatings for gas turbine engine components e.g. compressor, or turbine blades.

BACKGROUND OF THE INVENTION

It is known from European patent application no EP0366289A to produce multiple layer wear resistant coatings on the surface of a substrate using alternate layers of a metallic material and the nitride, oxide or carbide of the metallic material.

It is known from UK patent application no GB2170226A to produce multiple layer wear resistant coatings on the surface of a substrate using alternate layers of a metallic material and the carbide, or nitride, of a metallic material.

It is further known from European patent application no EP0289173A to produce multiple layer wear resistant coatings on the surface of a substrate using alternate layers of titanium and titanium nitride.

SUMMARY OF THE INVENTION

The present invention seeks to provide a novel multiple layer erosion resistant coating.

Accordingly the invention provides a multiple layer erosion resistant coating on a surface of a substrate, said coating comprising layers of metallic material alternating with layers of titanium diboride, said coating having at least two layers of metallic material and at least two layers of titanium diboride, the metallic material has a relatively high elastic modulus.

The metallic material may be tungsten, an alloy of tungsten, nickel or an alloy of nickel.

Preferably the ratio of the thickness of the titanium diboride layers to the thickness of the metallic material layers is between 0.5 and 2.

Preferably the titanium diboride layers and metallic material layers are equal in thickness.

Preferably each of the titanium diboride layers has a thickness of 5 micrometers or less.

Preferably the metallic material layers have thickness's between 0.3 and 1 micrometer.

Preferably each of the metallic material layers has a thickness of 5 micrometers or less.

Preferably the titanium diboride layers have thickness's between 0.3 and 1 micrometer.

Preferably there are up to seventy layers of metallic material and seventy layers of titanium diboride.

Preferably there are twenty five layers of metallic material and twenty five layers of titanium diboride.

Preferably the tungsten alloy comprises one or more of the elements titanium, chromium, aluminium, iron, nickel, cobalt, vanadium, tantalum, molybdenum, zirconium, hafnium, silicon and niobium.

The present invention also provides a method of producing a multiple layer erosion resistant coating on a surface of a substrate, comprising the steps of alternately depositing layers of metallic material and titanium diboride, the coating having at least two layers of titanium diboride and at least two layers of metallic material, the metallic material having a relatively high elastic modulus.

Preferably the deposition step comprises physical vapour deposition. Preferably the physical vapour deposition step comprises sputtering.

Preferably the method comprises initially depositing the metallic material on the surface of the substrate, and depositing the titanium diboride layer on the metallic material.

Wherein the metallic material is a nickel alloy, applying a DC positive bias of 100 volts to the substrate, alternately depositing nickel alloy layers to a thickness of between 0.3 micrometer and 1 micrometer and depositing titanium diboride layers to a thickness of between 0.3 micrometer and 1 micrometer.

Wherein the metallic material is tungsten or tungsten alloy, applying a DC positive bias of 30 volts to the substrate, alternately depositing tungsten or tungsten alloy layers to a thickness of between 0.3 micrometer and 1 micrometer and depositing titanium diboride layers to a thickness of between 0.3 micrometer and 1 micrometer.

Preferably depositing the metallic layers and the titanium diboride layers such that they are equal in thickness.

BRIEF DESCRIPTION OF THE DRAWINGS

The present invention will be more fully described by way of example with reference to the accompanying drawings, in which.

DETAILED DESCRIPTION OF THE INVENTION

Figure 1:
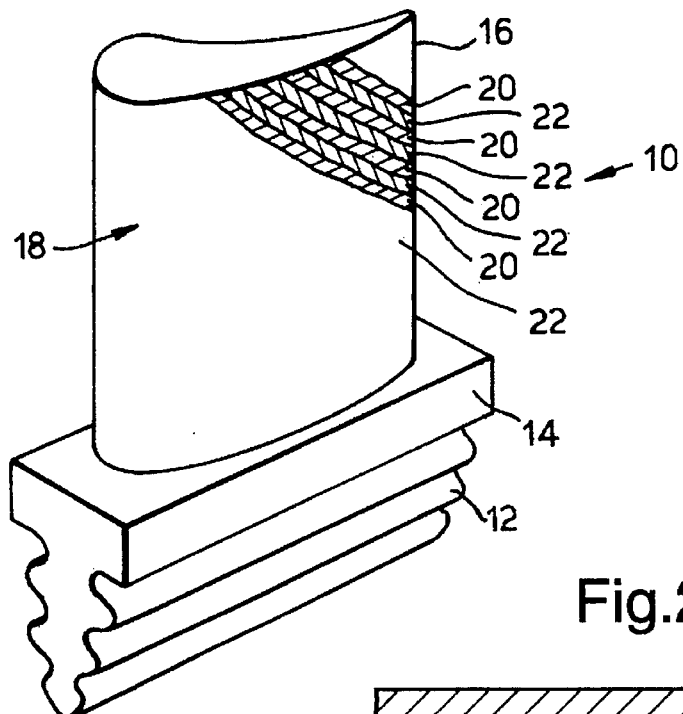
FIG. 1 is a perspective view of a gas turbine engine compressor blade according to the present invention.

A gas turbine engine compressor blade 10 is shown in FIG. 1. The compressor blade 10 comprises a shaped root portion 12, for attaching the compressor blade 10 to a compressor rotor, a platform portion 14, for defining a portion of the radially inner boundary of the gas flow path through the compressor, and an aerofoil portion 16, which compresses the gases passing through the compressor. The platform portion 14 and the aerofoil portion 16 of the compressor blade 10 are provided with a coating system 18 which protects the compressor blade 10 against erosion by particles entrained into the compressor of the gas turbine engine.

Figure 2:
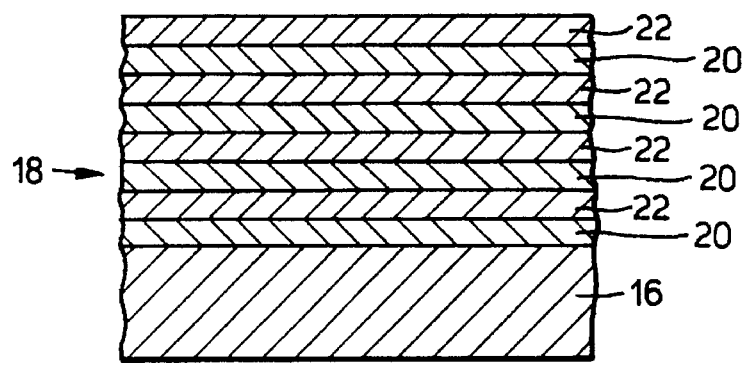
FIG. 2 is a sectional view through an article having a multiple layer erosion resistant coating according to the present invention.
Figure 3:
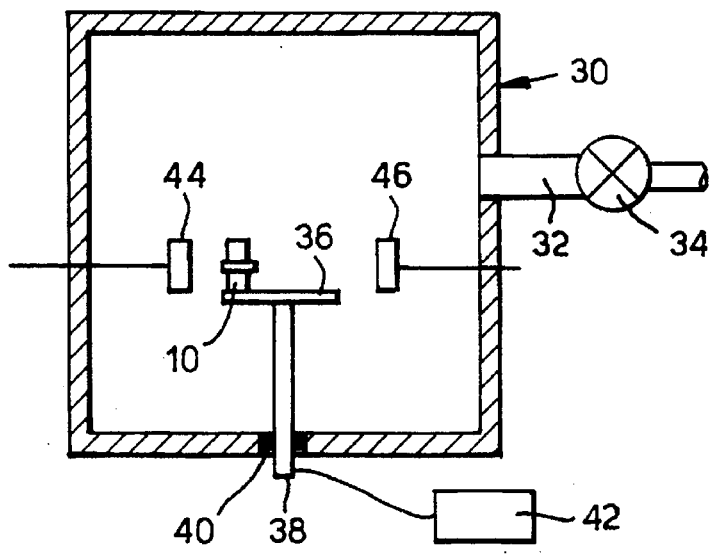
FIG. 3 is a sectional view through an apparatus for use in the method of applying the multiple layer erosion resistant coating according to the present invention.

The coating system 18 is a multiple layer erosion resistant coating comprising layers of metallic material 20 alternating with layers of titanium diboride 22, as seen more clearly in FIG. 2. A layer of metallic material 20 is initially deposited onto the metallic substrate 16 of the compressor blade 10 and finally a layer of titanium diboride 22 is deposited onto a layer of metallic material 20. The compressor blade 20 preferably has a titanium alloy, or steel, substrate, but may have an aluminium, an aluminium alloy, a nickel alloy, a polymer or a composite material substrate.

The metallic material is preferably nickel, nickel alloy, tungsten or tungsten alloy. The nickel alloy may be a nickel chromium alloy for example 75% nickel, 20% chromium with additions of titanium, cobalt, zirconium and carbon. The tungsten alloy may comprise one or more elements from the group titanium, chromium, aluminium, iron, nickel, cobalt, vanadium, tantalum, molybdenum, zirconium, hafnium, silicon and niobium.

An apparatus for depositing the coating system 18 onto the substrate 16 comprises a vacuum chamber 30 which has an outlet pipe 32 and a vacuum pump 34. The vacuum chamber 30 also has a substrate holder 36 which is rotatably mounted by a shaft 38 and bearings 40 about a vertical axis in the chamber 30. The substrate holder 36 is arranged in operation to hold one or more compressor blades 10, or other articles to be coated. The substrate holder 36 is also electrically connected to a voltage supply 42. At diametrically opposite positions relative to the axis of rotation of the substrate holder 36 are arranged a titanium diboride sputtering target 44 and a metallic material sputtering target 46. Each of the targets 44,46, is associated with a respective direct current planar magnetron sputtering source respectively. A high pressure ionisation source is provided to produce a high intensity auxiliary plasma beam.

In order to coat the compressor blades 10, they are initially mechanically polished and then precleaned in a suitable solvent and are then dried in hot air. The compressor blades 10 are clamped into the substrate holder 36 in the vacuum chamber 30. The vacuum chamber 30 is evacuated and is then backfilled with high purity argon to a working pressure of 0.2 Pa. Then the compressor blades 10 are heated by electron bombardment up to 500° C. and ion etched in pure argon at a negative bias potential of 200 volts for 15 minutes. Simultaneously the targets are cleaned by presputtering for 10 minutes at a power of 2200 watts applied to each target.

EXAMPLE 1

A nickel-chromium alloy, nimonic 75, target and a titanium diboride target were used. The argon pressure in the vacuum chamber was set to 0.5 Pa, a DC positive bias voltage of 100 volts was applied to the compressor blade. An input power of 2500 watts, corresponding to a target voltage of 530 volts, was applied to the nickel chromium alloy target and an input power of 2200 watts, corresponding to a target voltage of 480 volts, was applied to the titanium diboride target. The compressor blade to target distance was 90 mm.

Initially the substrate holder 36 is rotated so that the compressor blade 10 is adjacent the nickel chromium alloy target 46. The sputtering source 50 is then activated for 128 seconds for the deposition of a nickel chromium alloy layer 1 micrometer thick onto the compressor blade 10. The substrate holder 30 is then rotated so that the compressor blade 10 is adjacent the titanium diboride target 44. The sputtering source 48 is then activated for 683 seconds for deposition of a titanium diboride layer 1 micrometer in thickness on the nickel chromium alloy layer. The compressor blade 10 is maintained at a temperature less than 350° C. during these deposition processes.

A further twenty four pairs of nickel chromium alloy and titanium diboride layers were deposited.

This multilayer erosion resistant coating has a thickness of 50 micrometers and a hardness of 1400 Vickers measured under a load of 200 g.

Increased temperature of the compressor blades during the deposition process decreased the coating hardness.

EXAMPLE 2

A tungsten target and a titanium diboride target were used. The argon pressure in the vacuum chamber was set to 1.5 Pa, a DC positive bias voltage of 30 volts was applied to the compressor blade. An input power of 2200 watts, corresponding to a target voltage of 410 volts, was applied to the tungsten target and a tungsten layer 1 micrometer thick was deposited onto the compressor blade 10 in 256 seconds. The argon pressure was reduced to 0.2 Pa the substrate holder 36 was rotated so that the compressor blade was adjacent the titanium diboride target 44 and an input power of 2200 watts, corresponding to a target voltage of 480 volts, was applied to the titanium diboride target and a titanium diboride layer 1 micrometer thick was deposited onto the tungsten layer in 683 seconds. The compressor blade 10 is maintained at a temperature between 440° C. and 500° C. for deposition of the titanium diboride but an increase in temperature increased bonding between the layers and increased the hardness of the coating.

A further twenty four pairs of tungsten and titanium diboride layers were deposited.

This multilayer erosion resistant coating has a thickness of 50 micrometers and a hardness of 2400 Vickers measured under a load of 200 g.

EXAMPLE 3

A tungsten titanium alloy target and a titanium diboride target were used. All the tungsten titanium alloy layers were deposited at an argon pressure of 1.5 Pa and by applying a target power of 2000 watts for 276 seconds. All parameters for the deposition of the titanium diboride layers were the same as for example 1. Again twenty five pairs of layers of tungsten titanium alloy and titanium diboride were produced. This multilayer erosion resistant coating has a thickness of 50 micrometers and a hardness of 1500 Vickers.

The erosion rates and improvement factors for the multilayer erosion resistant coatings produced in examples 1, 2 and 3 are compared, in table 1, with an uncoated titanium, 6 aluminium, 4 vanadium alloy compressor blade and a prior art multilayer erosion resistant coating having alternate layers of titanium and titanium nitride, each of the layers is 1 micrometer in thickness and the coating has a total thickness of 50 micrometers. The coatings were compared for impact angles of 30° and 90° for 600 micrometer grit.

The erosion rate is measured in mg/Kg, and the improvement factor is defined as:

$$\frac{\text{Erosion rate of Ti6Al4V Alloy} \times \text{Density of the coating}}{\text{Erosion rate of the coating} \times \text{Density of Ti6Al4V Alloy}}$$

TABLE 1

|  | Impact Angle 30° | | Impact Angle 90° | |
| --- | --- | --- | --- | --- |
|  | Erosion Rate | Improvement Factor | Erosion Rate | Improvement Factor |
| Ti6A14V | 400 | 1 | 350 | 1 |
| Ti/TiN Coating | 150 | 3 | 320 | 1.2 |
| Example 1 | 33 | 17.4 | 440 | 1.1 |
| Example 2 | 3 | 350.6 | 9 | 102.2 |
| Example 3 | 3 | 308.6 | 9 | 90 |

Figure 4:
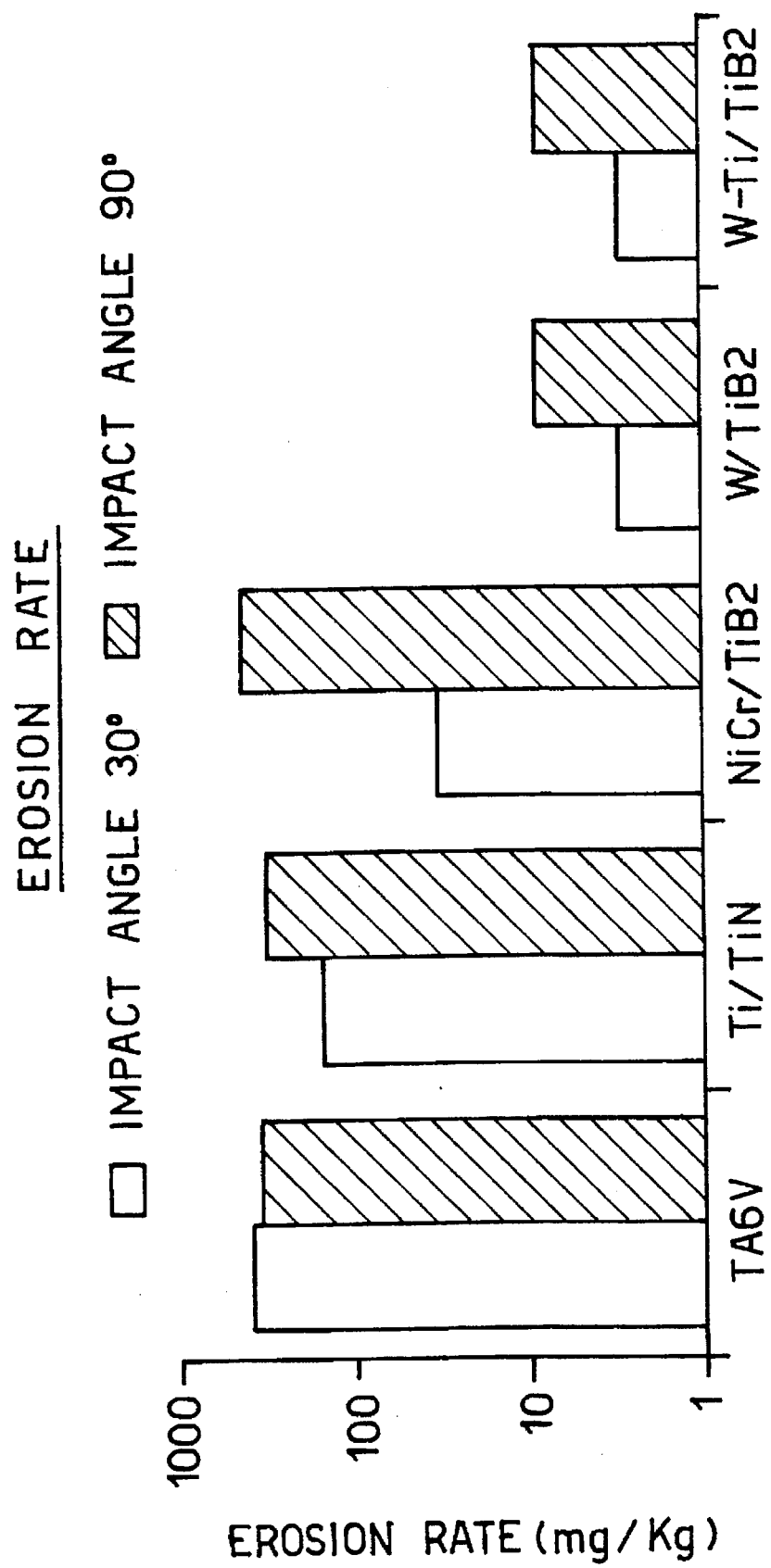
FIG. 4 is a bar graph comparing the erosion rate for particular erosion resistant coatings at particular impact angles.
Figure 5:
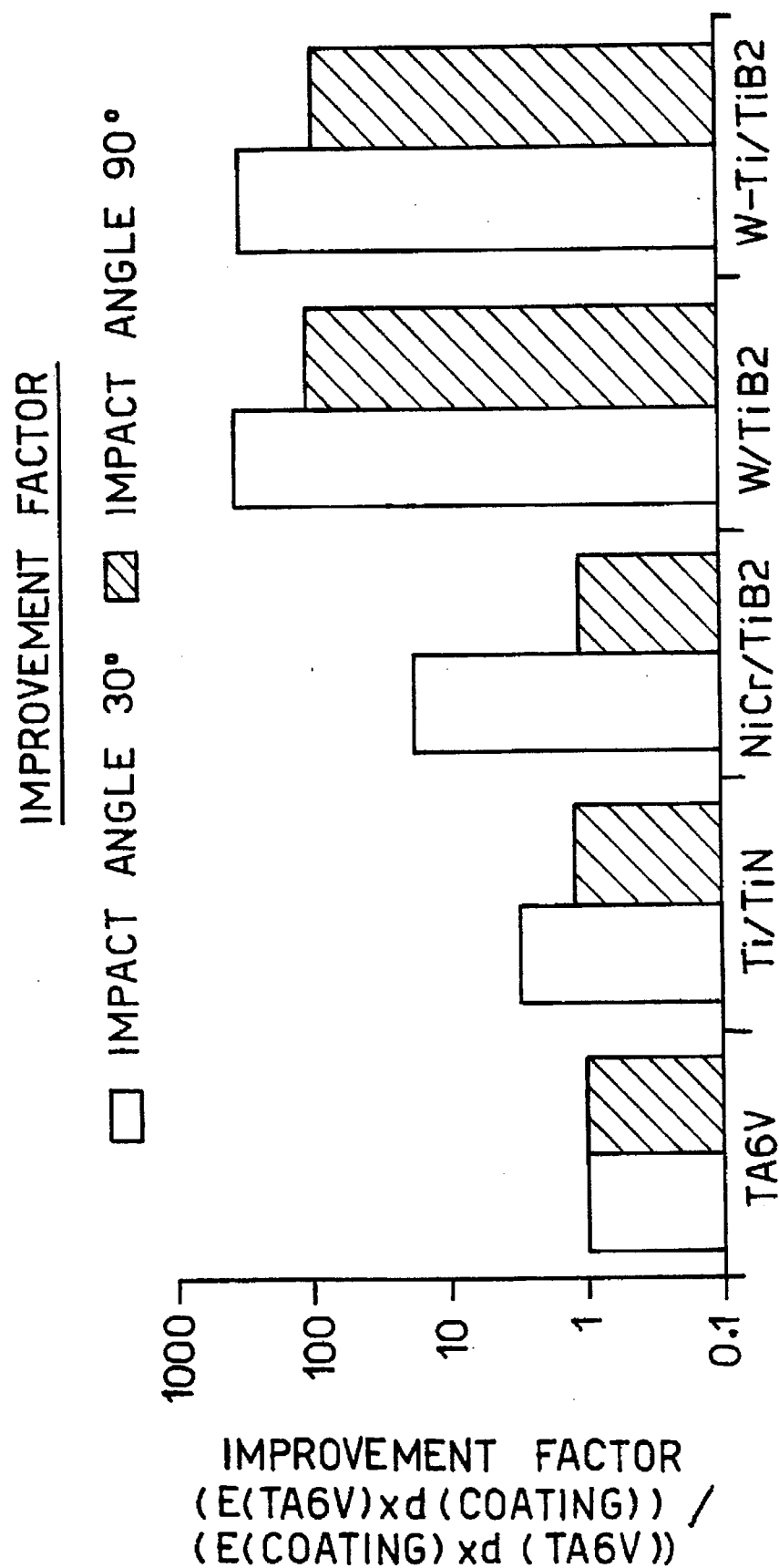
FIG. 5 is a bar graph comparing improvement factors for particular erosion resistant coatings at particular impact angles.

FIGS. 4 and 5 show the erosion rate and improvement factors.

Figure 6:
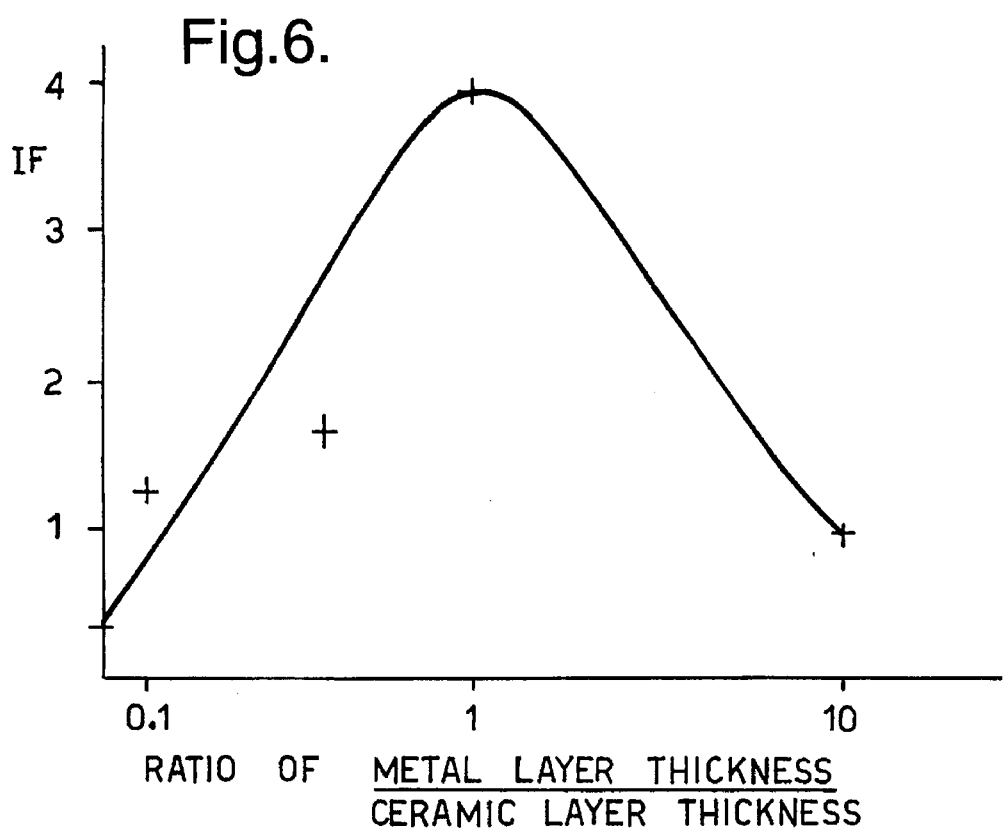
FIG. 6 is a graph of improvement factor against the ratio of metal layer thickness to ceramic layer thickness.

In further tests the ratio of the metal layer thickness to the ceramic layer thickness was varied. FIG. 6 shows the effect of varying the ratio of the metal layer thickness to the ceramic layer thickness for multilayer coatings for 90° impacts at 300 ms$^{-1}$ using 600 micrometer grit. It was determined that the best improvement factor, erosion resistance, is obtained when the ratio is 1 or substantially 1 as shown in FIG. 6 although ratios between 0.5 and 2 may be used.

Figure 7:
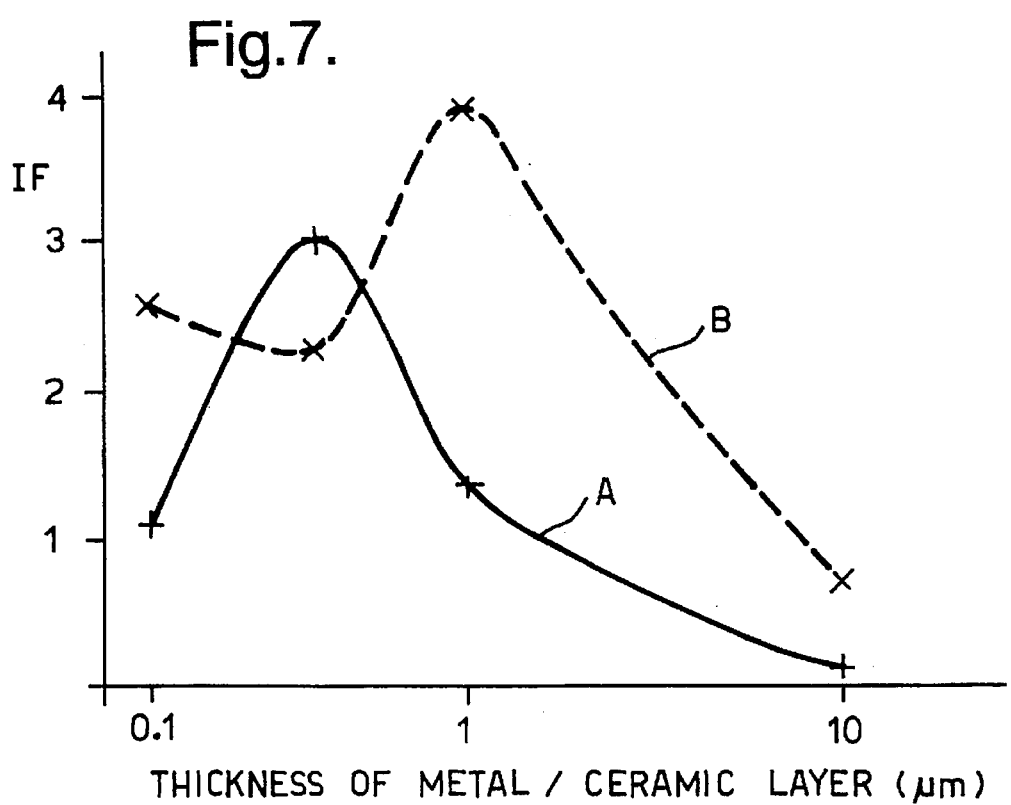
FIG. 7 is a graph of improvement factor against thickness of layers for a specific ratio of metal layer thickness to ceramic layer thickness.

In another series of tests the thickness of the individual layers was varied while maintaining a constant total coating thickness and maintaining a constant ratio of metallic material thickness to ceramic material thickness of 1. FIG. 7 shows the effect of varying the thickness of the metallic material and ceramic layers for 90° impacts at 300 ms$^{-1}$ for 200 micrometer and 600 micrometer grit. It was determined that the best improvement factor, erosion resistance, is obtained when the thickness of each layer is equal to or less than 1 micrometer and equal to or greater than 0.3 micrometers. The best improvement factor for 80 to 200 micrometer grit was obtained when the multiple layer erosion resistant coating has layers each of which is 0.3 micrometers in thickness as shown by line A in FIG. 7. The best improvement factor for 600 micrometer grit was obtained when the multiple layer erosion resistant coating has layers each of which is 1 micrometer in thickness as shown by line B in FIG. 7.

In our investigation of prior art coatings, typified by those disclosed in GB2170226A, EP0366289A, EP0289173A and other prior art coatings, by studying the material removal, erosion, rate as a function of erosion time, we found that the prior art coatings fall into two distinct groups.

The first group, the brittle material group, contains bulk ceramic coatings, hard monolayer coatings and hard/hard multilayer coatings. Examples of coatings within the first group are a titanium nitride monolayer coating, and alternate layers of titanium nitride and zirconium nitride to form a hard/hard multilayer coating. The first group has a relatively low material removal, erosion, rate with time for a 30° impact angle of grit, but has a relatively high material removal, erosion, rate with time for a 90° impact angle of grit.

The second group, the ductile material group, contains metal monlayers and soft/hard multilayer coatings. Examples of coatings within the second group are alternate layers of titanium and titanium nitride to form a soft/hard multilayer coating. The second group has a moderate material removal, erosion, rate with time for both 30° and 90° impact angles of grit. The second group therefore has a higher material removal, erosion, rate than the first group at a 30° impact angle, but has a lower material removal, erosion, rate than the first group at a 90° impact angle.

The coating according to the present invention comprising alternate layers of tungsten and titanium diboride behaves in a manner similar to the first group of coatings at low, 30°, impact angles, but at high, 90°, impact angles the coating exhibits a unique phenomenon in that an incubation period is observed within which all the particle impact energy is absorbed without any damage to the coating, thereafter the coating behaves in a manner similar to the second group of coatings.

The incubation period in the case of alternate layers of tungsten and titanium diboride, in one example was 8 minutes for 90° impacts with 600 micron grit before erosion of the coating started.

The incubation period is due, we believe, to the coatings ability to sustain high loads elastically, however once the coating is cracked the coating behaves like a coating of the second group of coatings.

The metallic material layers must have a relatively high elastic modulus, for example tungsten, alloys of tungsten, nickel and alloys of nickel, rather than a relatively low elastic modulus, for example titanium, aluminium. Tungsten has an elastic modulus of 406 GPa, nickel has an elastic modulus of 207 GPa, titanium has an elastic modulus of 116 GPa and aluminium has an elastic modulus of 71 GPa.

The coating system may also be applied to other compressor parts, for example a compressor blisk, or impeller, that is a compressor rotor with integral blades. The coating system is also applicable for tribological and other wear resistance purposes, for example in bearings etc.

The coating system may also be applied by low temperature chemical vapour deposition, for example by plasma assisted chemical vapour deposition.

The coating system of the present invention comprises at least two layers of metallic material and at least two layers of titanium diboride.

We claim:

1. A multiple layer erosion resistant coating on a surface of a substrate, said coating comprising layers of titanium diboride alternating with layers of metallic material, said coating having at least two layers of titanium diboride and at least two layers of metallic material, the metallic material having a relatively high elastic modulus, said metallic material being selected from the group consisting of tungsten, an alloy of tungsten, nickel and an alloy of nickel.

2. A coating as claimed in claim 1 wherein the ratio of the thickness of the titanium diboride layers to the thickness of the metallic material layers is between 0.5 and 2.

3. A coating as claimed in claim 2 wherein the titanium diboride layers and metallic material layers are equal in thickness.

4. A coating as claimed in claim 1 wherein each of the titanium diboride layers has a thickness of 5 micrometer or less.

5. A coating as claimed in claim 4 wherein each of the titanium diboride layers has a thickness between 0.3 micrometer and 1 micrometer.

6. A coating as claimed in claim 1 wherein each of the metallic material layers has a thickness of 5 micrometer or less.

7. A coating as claimed in claim 6 wherein each of the metallic material layers has a thickness between 0.3 micrometer and 1 micrometer.

8. A coating as claimed in claim 1 wherein there are up to seventy layers of metallic material and seventy layers of layers of titanium diboride.

9. A coating as claimed in claim 1 wherein there are twenty five layers of metallic material and twenty five layers of titanium diboride (22).

10. A multiple layer erosion resistant coating on a surface of a substrate, said coating comprising layers of titanium deboride alternating with layers of metallic material, said coating having at least two layers of titanium diboride and at least two layers of metallic material, the ratio of thickness of the titanium diboride layers to the thickness of the metallic material layers being between 0.5 and 2, each of the titanium diboride layers having a thickness between 0.3 micrometer and 1 micrometer, the metallic material having a relatively high elastic modulus, each of the metallic material layers having a thickness between 0.3 micrometer and 1 micrometer, the metallic material being selected from the group consisting of tungsten, an alloy of tungsten, nickel and an alloy of nickel.

11. A multiple layer erosion resistant coating on a surface of a substrate, said coating comprising layers of titanium diboride alternating with layers of metallic material, said coating having at least two layers of titanium diboride and at least two layers of metallic material, the metallic material having a relatively high elastic modulus, the metallic material being selected from the group consisting of tungsten and an alloy of tungsten.

* * * * *